(12) United States Patent
Joo et al.

(10) Patent No.: US 11,244,921 B2
(45) Date of Patent: Feb. 8, 2022

(54) SEMICONDUCTOR PACKAGE

(71) Applicant: SAMSUNG ELECTRONICS CO., LTD., Suwon-si (KR)

(72) Inventors: Chang Eun Joo, Suwon-si (KR); Sung Hoan Kim, Suwon-si (KR); Kyung Moon Jung, Suwon-si (KR); Yong Hwan Kwon, Suwon-si (KR); Young Kyu Lim, Suwon-si (KR); Seong Hwan Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 118 days.

(21) Appl. No.: 16/723,588

(22) Filed: Dec. 20, 2019

(65) Prior Publication Data

US 2020/0365545 A1 Nov. 19, 2020

(30) Foreign Application Priority Data

May 13, 2019 (KR) ........................ 10-2019-0055825

(51) Int. Cl.
*H01L 23/00* (2006.01)
*H01L 23/498* (2006.01)
(Continued)

(52) U.S. Cl.
CPC .............. *H01L 24/20* (2013.01); *H01L 23/13* (2013.01); *H01L 23/3128* (2013.01); *H01L 23/49816* (2013.01); *H01L 23/49822* (2013.01); *H01L 23/49833* (2013.01); *H01L 23/49838* (2013.01); *H01L 23/49866* (2013.01); *H01L 2224/211* (2013.01); *H01L 2224/2105* (2013.01);
(Continued)

(58) Field of Classification Search
CPC .............. H01L 24/20; H01L 23/49838; H01L 23/49816; H01L 23/49866; H01L 23/13; H01L 23/3128; H01L 23/49822; H01L 23/49833; H01L 2224/211; H01L 2224/215; H01L 2924/0105; H01L 2924/35121; H01L 2924/3512; H01L 2224/2105; H01L 23/49827
See application file for complete search history.

(56) References Cited

U.S. PATENT DOCUMENTS 8,445,329 B2 * 5/2013 Leung ............... H01L 23/49827
 438/125
9,490,192 B1 * 11/2016 Chen ..................... H01L 21/486
(Continued)

FOREIGN PATENT DOCUMENTS

KR 10-2017-0067393 A 6/2017
KR 10-2017-0142712 A 12/2017

*Primary Examiner* — Victor A Mandala
(74) *Attorney, Agent, or Firm* — Sughrue Mion, PLLC

(57) ABSTRACT

A semiconductor package is provided. The semiconductor package includes a connection structure, a semiconductor chip, and a connection metal. The connection structure includes a redistribution layer and a connection via layer. The semiconductor chip is disposed on the connection structure, and includes a connection pad. The connection metal is disposed on the connection structure and is electrically connected to the connection pad by the connection structure. The connection via layer includes a connection via having a major axis and a minor axis, and in a plan view, the minor axis of the connection via intersects with the connection metal.

20 Claims, 14 Drawing Sheets

(51) Int. Cl.
*H01L 23/13* (2006.01)
*H01L 23/31* (2006.01)

(52) U.S. Cl.
CPC *H01L 2224/215* (2013.01); *H01L 2924/0105* (2013.01); *H01L 2924/3512* (2013.01); *H01L 2924/35121* (2013.01)

(56) References Cited

U.S. PATENT DOCUMENTS

| | | | |
|---|---|---|---|
| 2006/0131758 A1* | 6/2006 | Dao | H05K 1/114 |
| | | | 257/779 |
| 2006/0237855 A1* | 10/2006 | Kroehnert | H01L 23/49811 |
| | | | 257/779 |
| 2009/0057001 A1* | 3/2009 | Jung | H01L 24/24 |
| | | | 174/264 |
| 2009/0278263 A1* | 11/2009 | McCarthy | H01L 24/02 |
| | | | 257/778 |
| 2011/0026232 A1* | 2/2011 | Lin | H01L 24/96 |
| | | | 361/760 |
| 2011/0074041 A1* | 3/2011 | Leung | H05K 1/113 |
| | | | 257/774 |
| 2012/0153499 A1* | 6/2012 | Byun | H01L 25/105 |
| | | | 257/774 |
| 2016/0013144 A1* | 1/2016 | Chen | H01L 23/3128 |
| | | | 257/774 |
| 2018/0151513 A1* | 5/2018 | Stone | H01L 24/11 |
| 2018/0233432 A1* | 8/2018 | Kim | H01L 24/13 |
| 2019/0057934 A1* | 2/2019 | Lin | H01L 21/486 |
| 2019/0096841 A1* | 3/2019 | Liu | H01L 23/5384 |

\* cited by examiner

SEMICONDUCTOR PACKAGE

This application claims priority under 35 U.S.C. § 119 to Korean Patent Application No. 10-2019-0055825 filed on May 13, 2019 in the Korean Intellectual Property Office, the disclosure of which is incorporated by reference herein in its entirety.

BACKGROUND

1. Field

The present disclosure relates to a semiconductor package.

2. Description of Related Art

One of the main trends in recent technological development is to reduce the size of components, and it is necessary to implement a large number of fins with a small size in the package field. In accordance with this technical requirement, recently vias of a redistribution part responsible for redistributing connection pads of the semiconductor chip may be finely formed.

A recent issue in packaging technology relates to the reliability of the vias of redistribution part. The vias used for redistributing the connection pads of the semiconductor chip become finer, such that when the vias are exposed to a harsh environment, peeling occurs or cracks often occur at the interface of the vias. Therefore, it is advantageous to minimize structural stress applied to the vias, and to minimize defects due to interface peeling or cracking.

SUMMARY

It is an aspect to provide a semiconductor package that may effectively reduce the structural stress of a connection via of a connection structure.

According to an aspect of an example embodiment, there is provided a semiconductor package comprising a connection structure having a first surface, and a second surface opposite to the first surface, the connection structure including a redistribution layer and a connection via layer; a semiconductor chip disposed on the first surface of the connection structure; and a plurality of connection metals disposed on the second surface of the connection structure, wherein the connection via layer comprises a plurality of connection vias, a first connection via of the plurality of connection vias is electrically connected to a first connection metal of the plurality of connection metals, and in plan view, when a center of the first connection metal is denoted by C1, a center of the first connection via is denoted by C2, a line passing through C1 and C2 is denoted by L1, a line intersecting L1 and passing through C2 is denoted by L2, a distance between two points on an edge of the first connection via that are on L1 is denoted by D1, a distance between two points on an edge of the first connection via that are on L2 is denoted by D2, and an angle formed by L1 and L2 is denoted by θ1, the following relationships are satisfied: D1<D2 and 30°≤θ1≤90°.

According to another aspect of an example embodiment, there is provided a semiconductor package comprising a connection structure including a redistribution layer and a connection via layer; a semiconductor chip above the connection structure; and a plurality of connection metals below the connection structure, including a first connection metal and a second connection metal, wherein the connection via layer includes a first connection via electrically connected to the first connection metal and a second connection via electrically connected to the second connection metal, in plan view, a length of a first line between any two points on an edge of the first connection via and passing through a center of the first connection via is longer than a length of a second line between any other two points on the edge of the first connection via and passing through the center of the first connection via, in the plan view, a length of a third line between any two points on an edge of the second connection via passing through a center of the second connection via, is longer than a length of a fourth line between any other two points on the edge of the second connection via passing through the center of the second connection via, and in the plan view, an angle formed by the first line and a fifth line, the fifth line passing through the center of the first connection via and a center of the semiconductor package, and an angle formed by the third line and a sixth line, the sixth line passing through the center of the second connection via and the center of the semiconductor package, are different from each other.

According to another aspect of an example embodiment, there is provided a semiconductor package comprising a connection structure including a plurality of connection via layers; a semiconductor chip above the connection structure; and a connection metal below the connection structure, wherein at least two connection via layers of the plurality of connection via layers include a first connection via electrically connected to the connection metal, respectively, in plan view, a length of a first line between any two points on an edge of the first connection via and passing through a center of the first connection via is longer than a length of a second line between any other two points on the edge of the first connection via and passing through the center of the first connection via, and each of the first connection via of the at least two connection via layers is vertically stacked to at least partially overlap in the plan view.

According to another aspect of an example embodiment, there is provided a semiconductor package comprising a connection structure including a redistribution layer and a connection via layer; a semiconductor chip disposed on the connection structure, the semiconductor chip including a connection pad; a connection metal disposed on the connection structure and electrically connected to the connection pad by the connection structure, wherein the connection via layer includes a connection via having a major axis and a minor axis, and in a plan view, the minor axis of the connection via intersects with the connection metal.

BRIEF DESCRIPTION OF DRAWINGS

The above and other aspects will be more clearly understood from the following detailed description, taken in conjunction with the accompanying drawings, in which.

DETAILED DESCRIPTION

Figure 1:
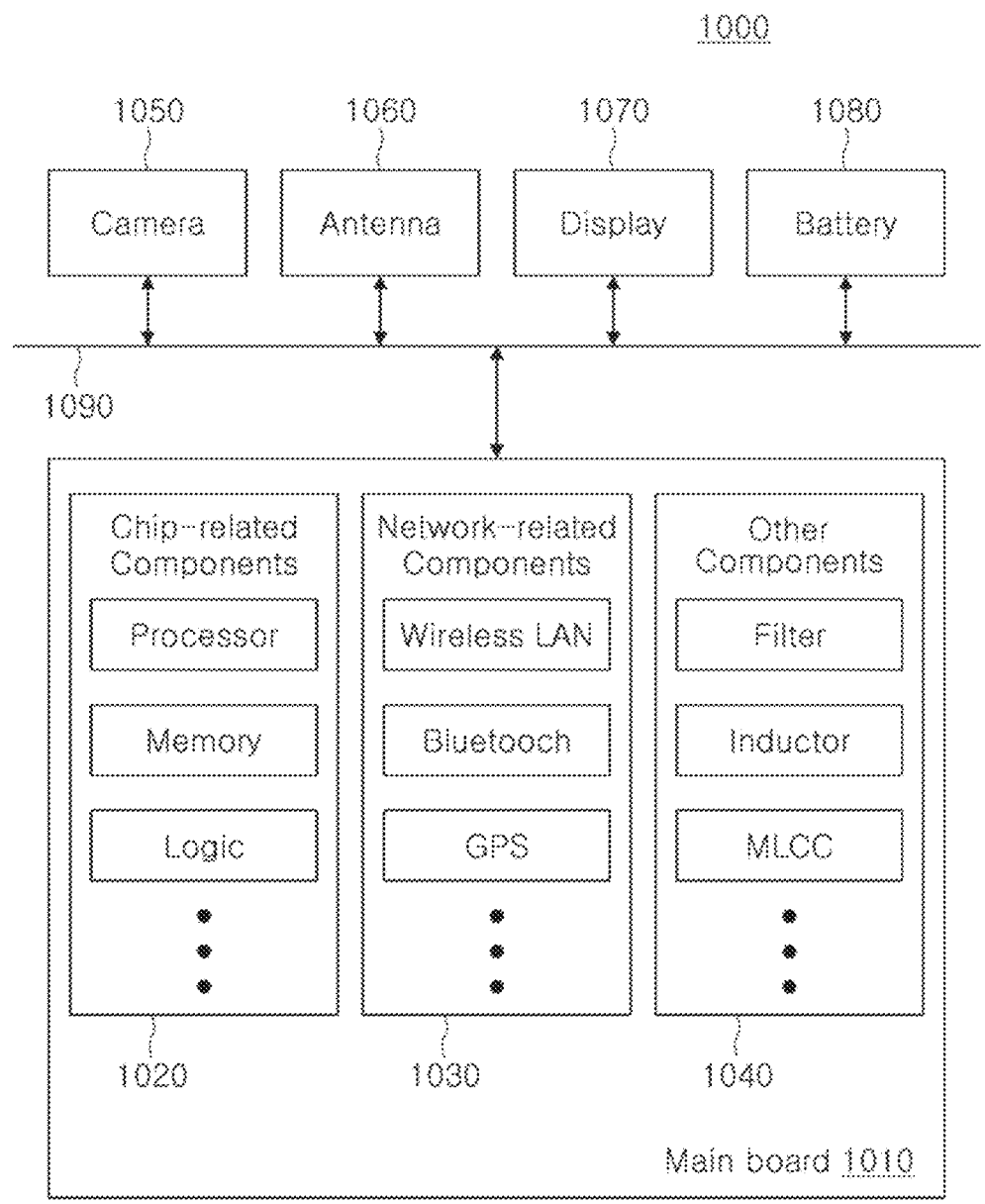
FIG. 1 is a schematic block diagram illustrating an example of an electronic device system.

Hereinafter, embodiments will be described as follows with reference to the attached drawings. The shape and size of elements in the drawings may be exaggerated or reduced for clarity.

Example embodiments introduce a non-circular via as a connection via of a connection structure such that the non-circular via is arranged to satisfy a particular relationship in relation to a connection metal such as a solder ball.

First, a general environment in which semiconductor packaging technology is found and features of various types of semiconductor packaging technology will be described with reference to the accompanying drawings.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip set related components 1020, network related components 1030, other components 1040, and the like, physically or electrically connected thereto. These components may be connected to others to be described below to form various signal lines 1090.

The chip set related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip set related components 1020 are not limited thereto, but may also include other types of chip related components. In addition, the chip set related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip set related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip set related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
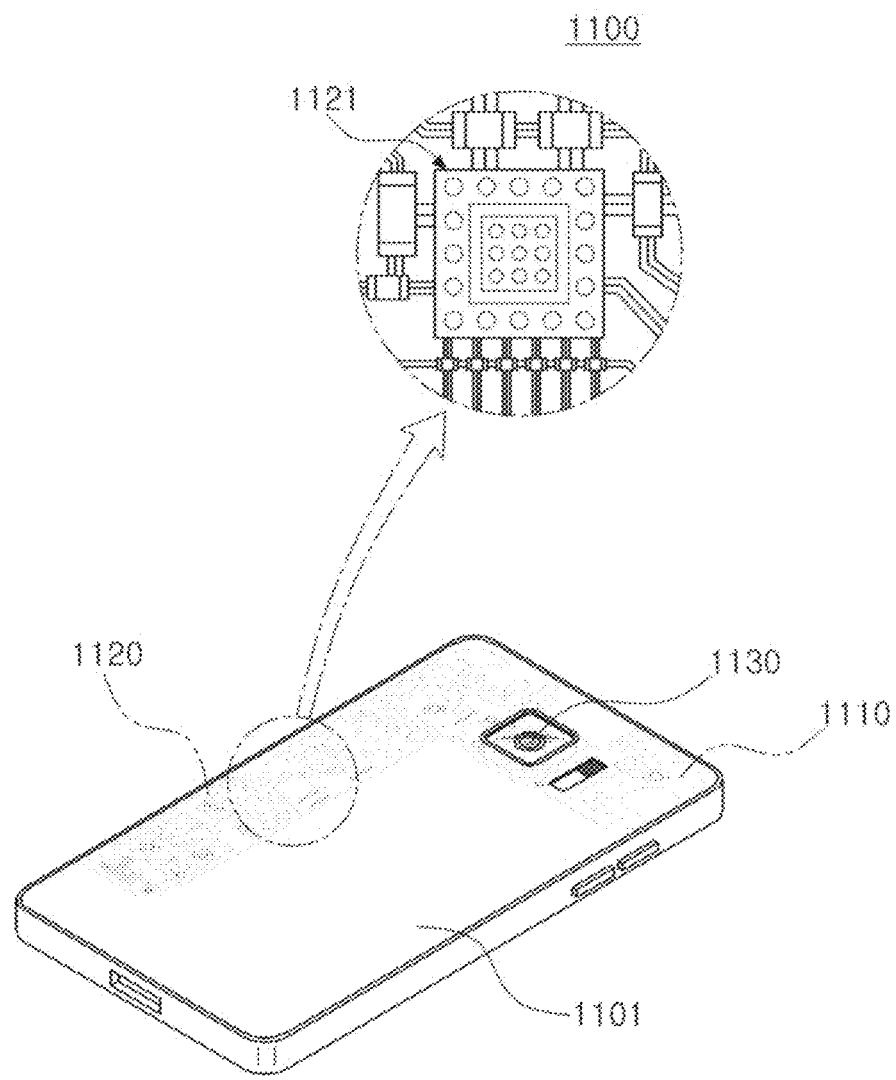
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
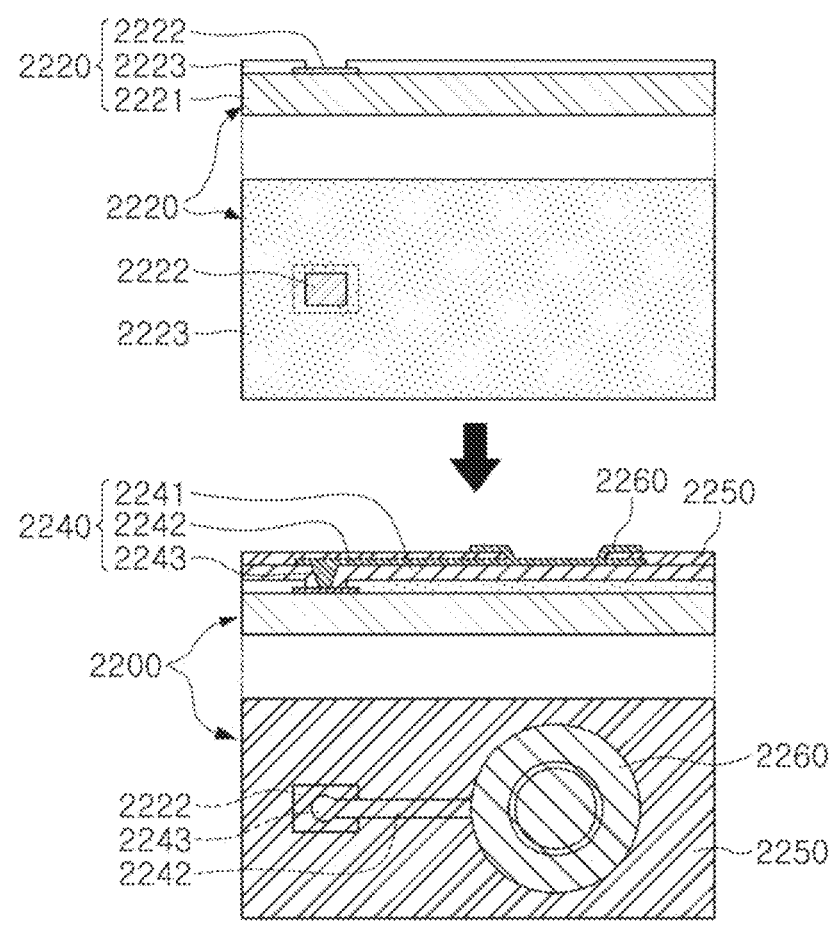
FIGS. 3A and 3B are schematic cross-sectional views illustrating states of a fan-in semiconductor package before and after being packaged.
Figure 3B:
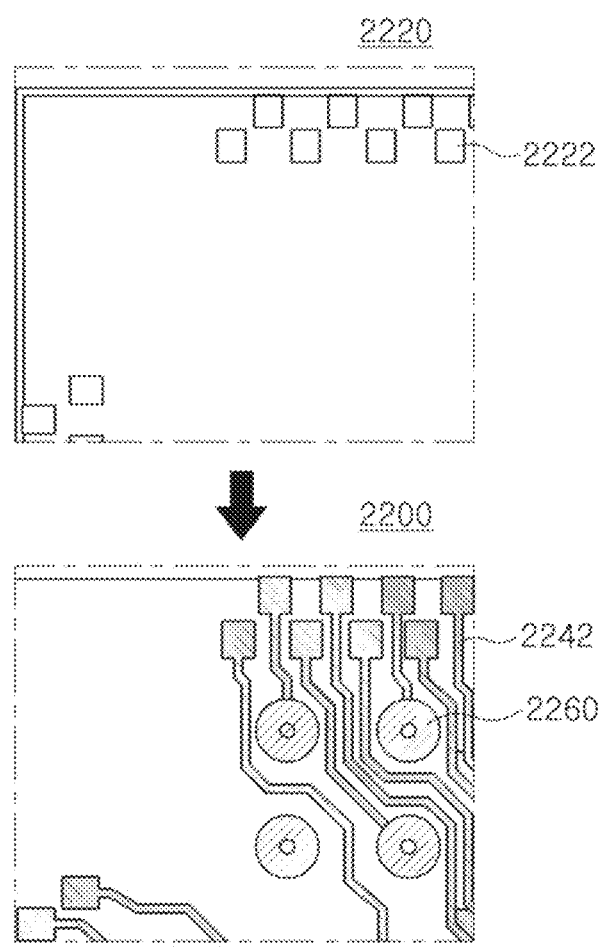

FIGS. 3A and 3B are schematic cross-sectional views illustrating states of a fan-in semiconductor package before and after being packaged.

Figure 4:
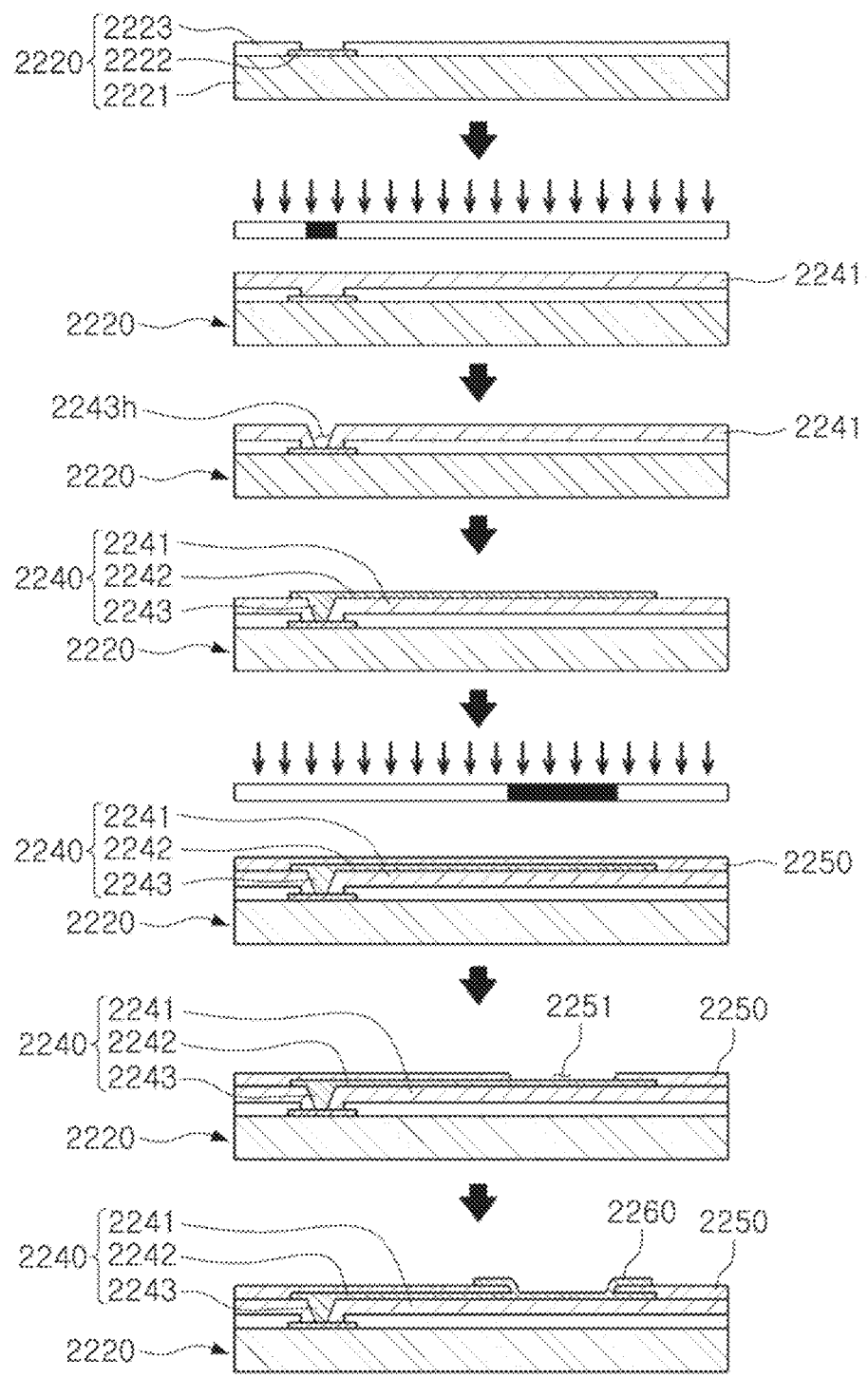
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. For example, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
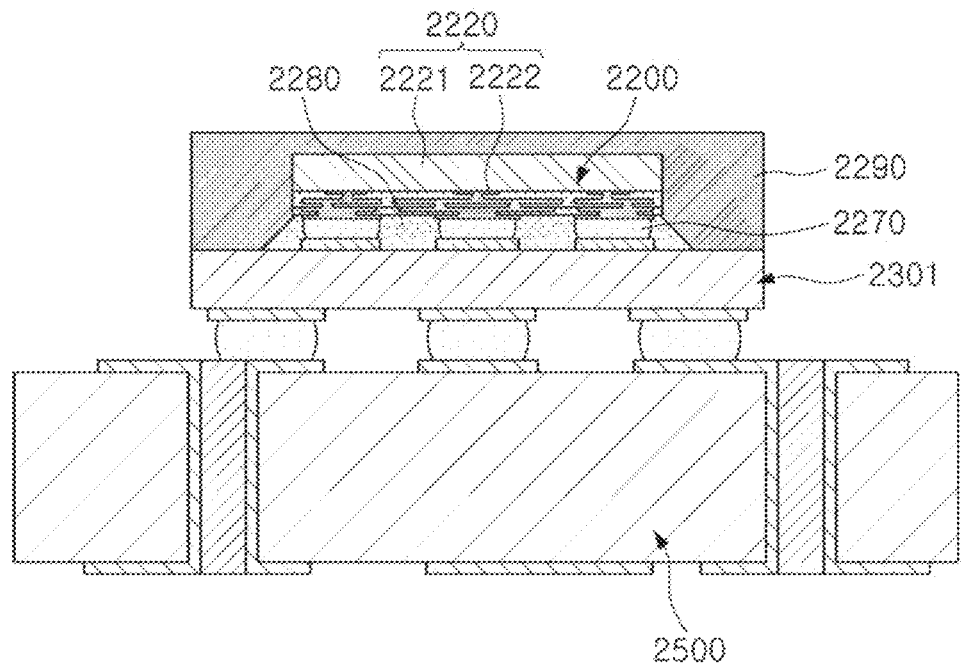
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board and is ultimately mounted on a mainboard of an electronic device.

Figure 6:
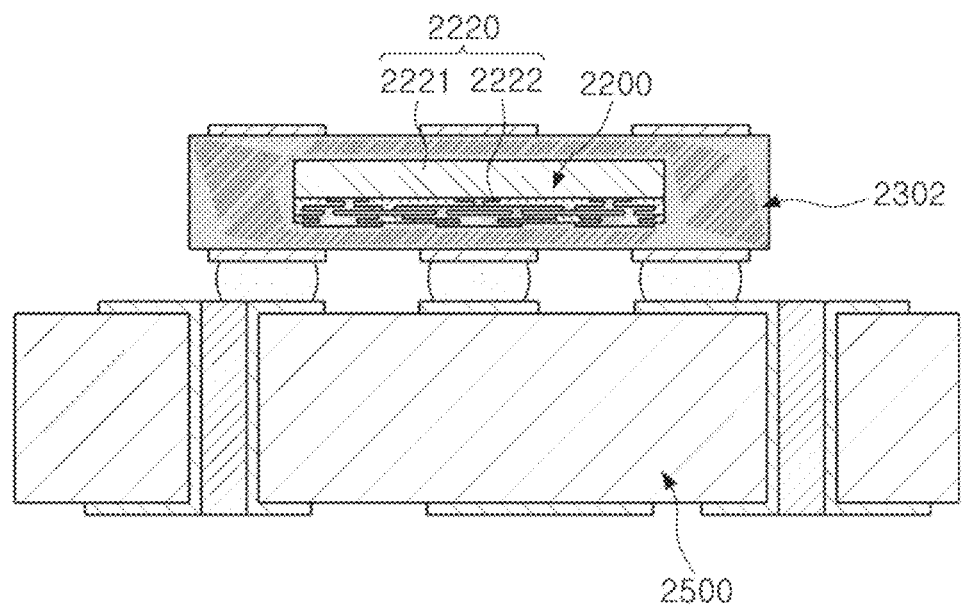
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-Out Semiconductor Package

Figure 7:
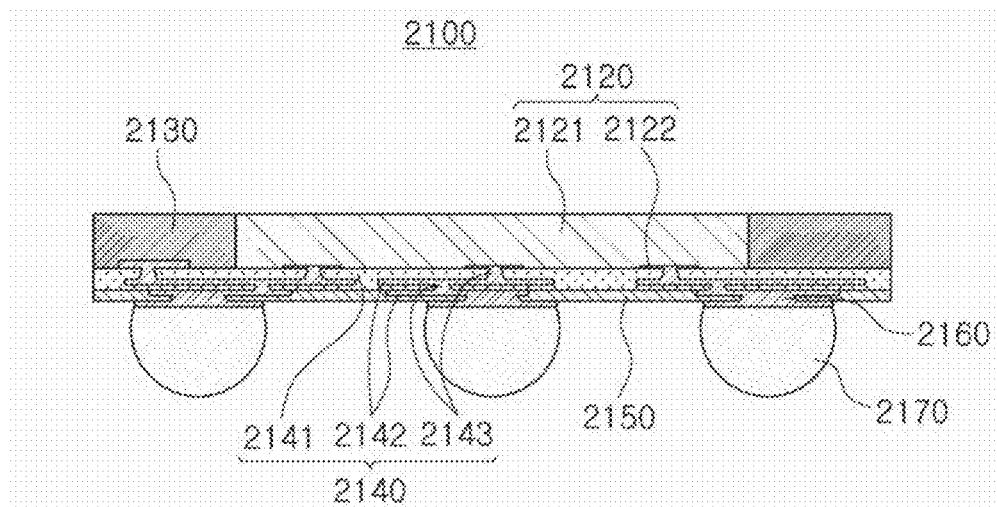
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an under-bump metal layer 2160 may further be formed in openings of the passivation layer 2150. Solder balls 2170 may further be formed on the under-bump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
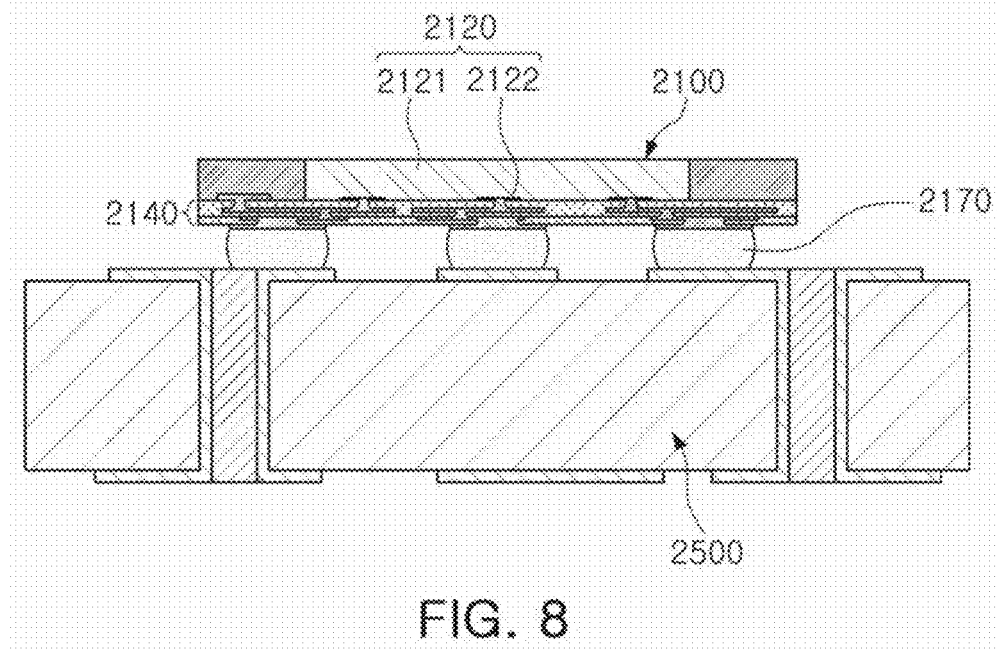
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. For example, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

Hereinafter, a semiconductor package capable of effectively reducing the structural stress of the connection via of the connection structure, according to example embodiments, will be described with reference to the drawings.

Figure 9:
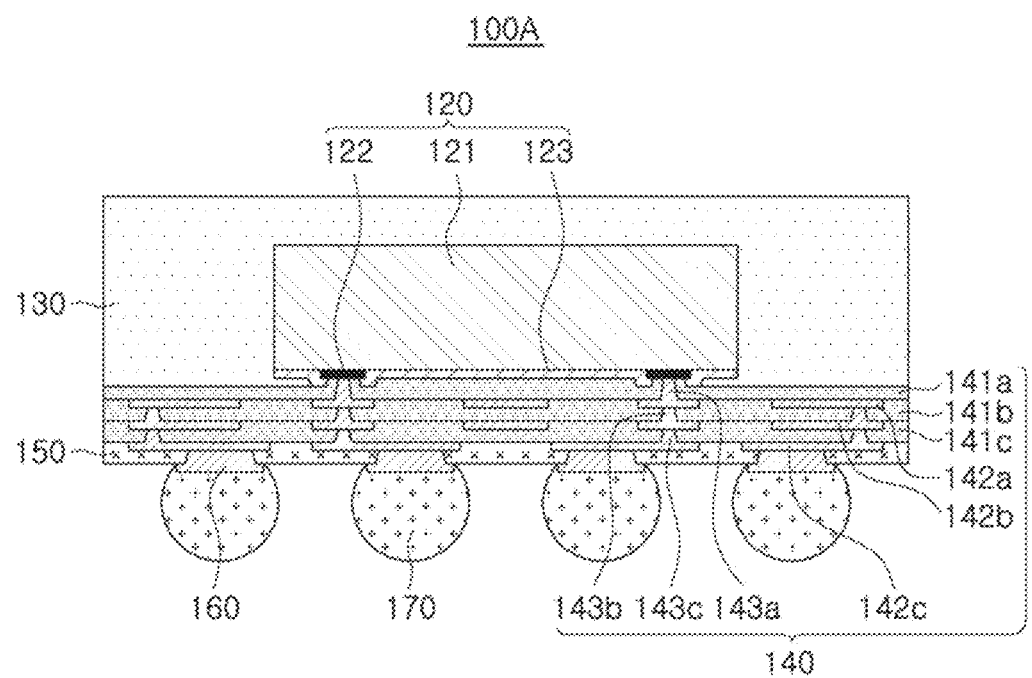
FIG. 9 is a cross-sectional view schematically illustrating an example of a semiconductor package, according to example embodiments.

FIG. 9 is a cross-sectional view schematically illustrating an example of a semiconductor package, according to example embodiments.

Figure 10:
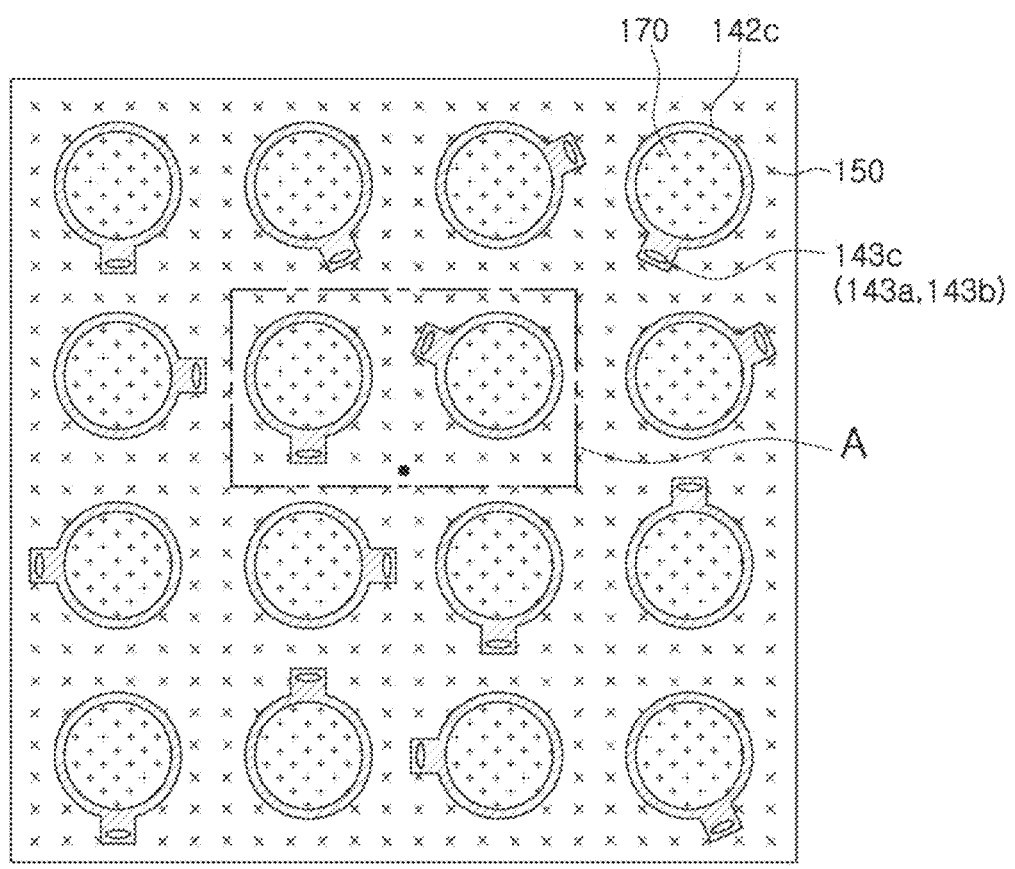
FIG. 10 is a plan view schematically illustrating arrangement of connection vias of a connection structure to a connection metal of a semiconductor package of FIG. 9, according to example embodiments.

FIG. 10 is a plan view schematically illustrating arrangement of connection vias of a connection structure to a connection metal of a semiconductor package of FIG. 9, according to example embodiments.

Figure 11:
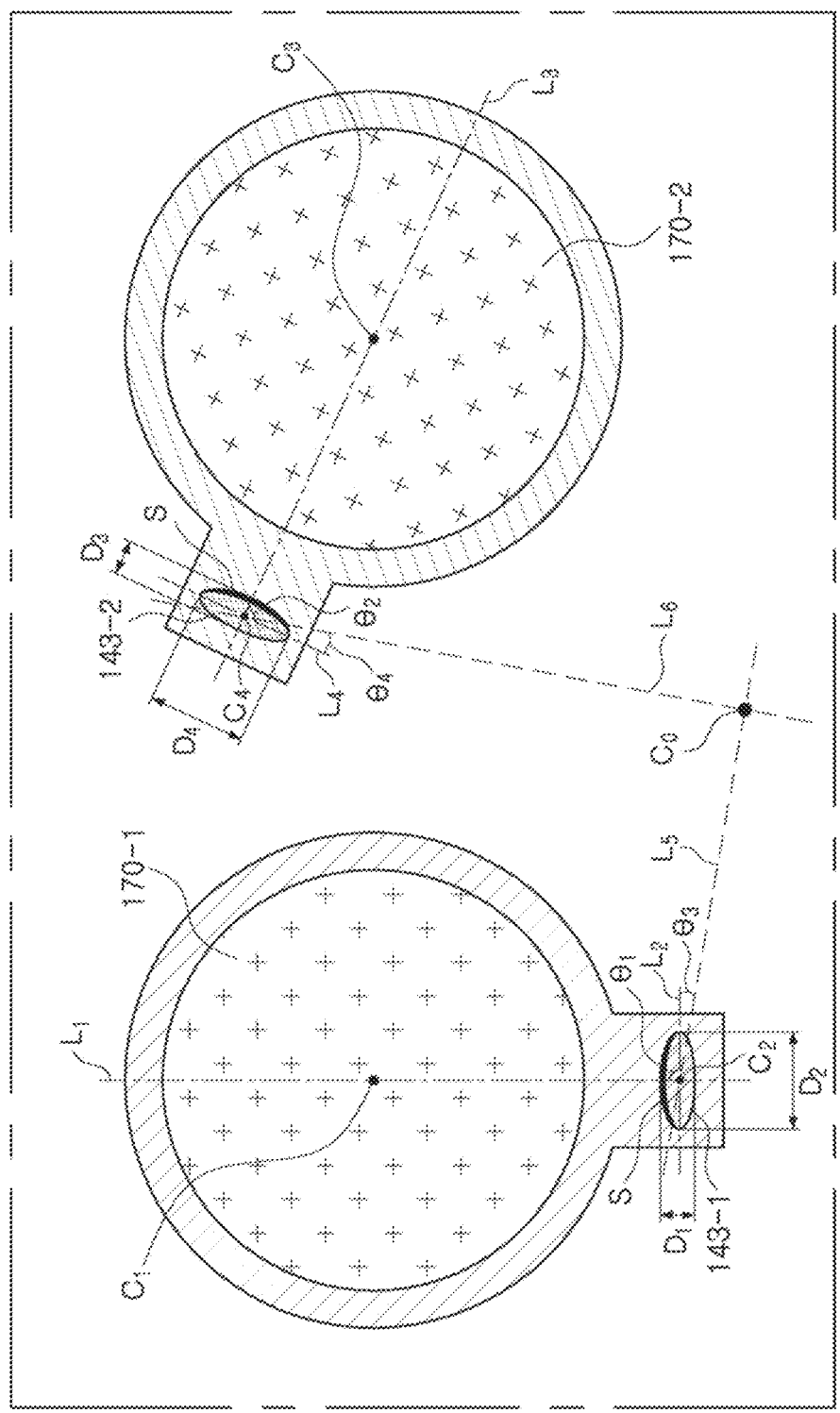
FIG. 11 is a plan view schematically illustrating a partial enlargement of region A of FIG. 10, according to example embodiments.

FIG. 11 is a plan view schematically illustrating a partial enlargement of region A of FIG. 10, according to example embodiments.

Referring to FIGS. 9-11, a semiconductor package 100A may include a connection structure 140 having an upper surface and a lower surface opposite to each other, a semiconductor chip 120 disposed on the upper surface of the connection structure 140, an encapsulant 130 disposed on the upper surface of the connection structure 140 to cover at least a portion of the semiconductor chip 120, a passivation layer 150 disposed on the lower surface of the connection structure 140, and a plurality of under-bump metals 160 disposed in a plurality of openings of the passivation layer 150, and a plurality of connection metals 170 connected to the plurality of under-bump metals 160. The connection structure 140 may include a plurality of insulation layers 141a, 141b, and 141c, a plurality of redistribution layers 142a, 142b, and 142c, and a plurality of connection via layers 143a, 143b, and 143c. Each of the connection via layers 143a, 143b, and 143c may include a plurality of connection vias.

At least one of the plurality of connection via layers 143a, 143b, and 143c may include a first connection via 143-1 as one of the plurality of connection vias (best seen in FIG. 11). The first connection via 143-1 may be electrically connected to a first connection metal 170-1 of the plurality of connection metals 170. Similarly, at least one of the plurality of connection via layers 143a, 143b, and 143c may include a second connection via 143-2 as the other of the plurality of connection vias. The second connection via 143-2 may be electrically connected to a second connection metal 170-2 of the plurality of connection metals 170.

In this case, in plan view, if a center of the first connection metal 170-1 is denoted by $C_1$, a center of the first connection via 143-1 is denoted by $C_2$, a line passing through $C_1$ and $C_2$ is denoted by $L_1$, a line intersecting $L_1$ and passing through $C_2$ is denoted by $L_2$, a distance between two points on an edge of the first connection via 143-1 that are on $L_1$ is denoted by $D_1$, a distance between two points on an edge of the first connection via 143-1 that are on $L_2$ is denoted by $D_2$, and an angle formed by $L_1$ and $L_2$ is denoted by $\theta_1$ (as shown in FIG. 11), the following relationships are satisfied: $D_1 < D_2$, and $30° \leq \theta_1 \leq 90°$. In some embodiments, the relationship $50° \leq \theta_1 \leq 90°$ may be satisfied. Herein the term "edge" of the first connection via 143-1 refers to the entire perimeter or circumference of the first connection via 143-1. Similarly, in plan view, if a center of the second connection metal 170-2 is denoted by $C_3$, a center of the second connection via 143-2 is denoted by $C_4$, a line passing through $C_3$ and $C_4$ is denoted by $L_3$, a line intersecting $L_3$ and passing through $C_4$ is denoted by $L_4$, a distance between two points on an edge of the second connection via 143-2 that are on $L_3$ is denoted by $D_3$, a distance between two points on an edge of the second connection via 143-2 that are on $L_4$ is denoted by $D_4$, and an angle formed by $L_3$ and $L_4$ is denoted by $\theta_2$ (as shown in FIG. 11), the following relationships are satisfied: $D_3 < D_4$, and $30° \leq \theta_2 \leq 90°$. In some embodiments, the relationship $50° \leq \theta_2 \leq 90°$ may be satisfied. Herein the term "edge" of the second connection via 143-2 refers to the entire perimeter or circumference of the second connection via 143-2. In some embodiments, $D_2$ may be a distance of a longest major axis among the distances between any two points on the edge of the first connection via 143-1 on a line that passes through $C_2$. Further, in some embodiments, $D_4$ may be a distance of a longest major axis among the distances between any two points on the edge of the second connection via 143-2 on a line that passes through $C_4$. The angles $\theta_1$ and $\theta_2$ may be based on an acute angle, unless they are 0° and/or 90°, respectively.

Generally, stress S applied to the first and second connection vias 143-1 and 143-2 may be concentrated on surfaces facing centers of each of the first and second connection metals 170-1 and 170-2 electrically connected to the first and second connection vias 143-1 and 143-2 (e.g., darker shaded surfaces in FIG. 11). Therefore, in cases in which areas of the stress-concentrated surfaces of the first and second connection vias 143-1 and 143-2 are widened as compared with the case in which the stress-concentrated surfaces have a circular shape, the stress applied to the first and second connection vias 143-1, 143-2 may be dispersed. For example, when the first and second connection vias 143-1 and 143-2 satisfy the above-described relationships in relation to the first and second connection metals 170-1 and 170-2, the first and second connection vias 143-1 and 143-2 may have a non-circular shape, and each of long axes of the connection vias 143-1 and 143-2 may be arranged substantially perpendicular to each of the centers of the first and second connection metals 170-1 and 170-2. Therefore, the stress applied to the first and second connection vias 143-1 and 143-2 may be effectively dispersed.

On the plane, if a center of the semiconductor package 100A is denoted by $C_0$ (best seen in FIG. 10), a line passing through $C_0$ and $C_2$ is denoted by $L_5$, a line passing through $C_0$ and $C_4$ is denoted by $L_6$, an angle formed by $L_2$ and $L_5$ is denoted by $\theta_3$, and an angle formed by $L_4$ and $L_6$ is denoted by $\theta_4$ (as shown in FIG. 11), $\theta_3$ and $\theta_4$ may be different from each other. For example, when the first and second connection vias 143-1 and 143-2 are arranged to satisfy the above-described relationships in relation to the centers of the first and second connection metals 170-1 and 170-2, independently of the center of the semiconductor package 100A, the stress may be effectively dispersed. The angles $\theta_3$ and $\theta_4$ may be based on an acute angle, unless they are 0° and/or 90°, respectively.

On the plane, the first and second connection vias 143-1 and 143-2 are arranged so as not to overlap the first and second connection metals 170-1 and 170-2, respectively. In this case, stress transmitted from the first and second connection metals 170-1 and 170-2 to the first and second connection vias 143-1 and 143-2, respectively, may be reduced while flowing along a connection path. Therefore, the stress applied to the first and second connection vias 143-1 and 143-2 may be more effectively dispersed.

The first and second connection vias 143-1 and 143-2 may be connection vias of at least a lowest connection via layer 143c among the plurality of connection via layers 143a, 143b, and 143c. In a path electrically connected to the first and second connection metals 170-1 and 170-2, respectively, a case in which connection vias located closest to each of the first and second connection metals 170-1 and 170-2 are the first and second connections vias 143-1 and 143-2, satisfying the above-described relationships, may be more effective for the above stress dispersion effect. The first and second connection vias 143-1 and 143-2, as above, may be also applied to the connection via layers 143a and 143b located on different levels. That is, the relationships described above may also be applied to connection vias of the connection via layers 143a and 143b located on different levels.

Not only the relationships between the first and second connection vias 143-1 and 143-2 and the first and second connection metals 170-1 and 170-2, but also relationships between other connection vias and connection metals, may also satisfy the above-described relationships, as exemplarily illustrated in FIG. 10.

Hereinafter, each configuration included in the semiconductor package 100A according to example embodiments will be described in more detail.

The semiconductor chip 120 may be an integrated circuit (IC) in which hundreds to millions of devices are integrated into one chip. The semiconductor chip 120 may be, for example, an application processor chip such as a central processor (for example, a central processing unit (CPU)), a graphics processor (for example, a graphics processing unit (GPU)), a field programmable gate array (FPGA), a digital signal processor, a cryptographic processor, a microprocessor, and/or a processor chip such as a microcontroller, specifically, an application processor (AP), but not limited thereto. The semiconductor chip 120 may be a memory chip such as a volatile memory (for example, a dynamic random access memory (DRAM)), a non-volatile memory (for example, a read only memory (ROM)), a flash memory, or the like; and a logic chip such as an analog-to-digital converter, an application-specific integrated circuit (ASIC), or the like.

The semiconductor chip 120 may be a die formed on the basis of an active wafer, and silicon (Si), germanium (Ge), gallium arsenide (GaAs), or the like may be used as the base material of a body 121. The body 121 may have various circuits. A connection pad 122 may be for electrically connecting the semiconductor chip 120 to other components, and formation materials thereof may be metal materials such as copper (Cu), aluminum (Al), or the like. A passivation film 123 exposing the connection pad 122 may be formed on the body 121, and the passivation film 123 may be an oxide film or a nitride film, or may be a double layer of an oxide film and a nitride film. An insulation film (not illustrated) or the like may be further disposed in a necessary position. Each of the semiconductor chips 120 may be a bare die. As necessary, the semiconductor chip 120 may be also a packaged die in which a separate redistribution layer (not illustrated) is further formed on a surface on which the connection pad 122 is disposed, for example, an active surface.

The encapsulant 130 may be an additional structure for protecting the semiconductor chip 120. An encapsulation form thereof is not particularly limited. For example, the encapsulant 130 may cover at least a portion of the semiconductor chip 120. A material of the encapsulant 130 is not particularly limited. For example, an insulating material may be used. As the insulating material, a thermosetting resin such as an epoxy resin, a thermoplastic resin such as polyimide, or a mixture of these resins with an inorganic filler, or a material impregnated with a core material such as a glass fiber, a glass cloth, or a glass fabric, together with an inorganic filler, such as a prepreg, an Ajinomoto Build-up Film (ABF), FR-4, a bismaleimide triazine (BT), or the like, may be used. As necessary, a photo-imageable encapsulant (PIE) resin may be used.

The connection structure 140 may redistribute the connection pad 122. Several tens to several millions of the connection pads 122 having various functions may be redistributed through the connection structure 140, and may be physically and/or electrically connected to the outside, in accordance with their functions through the connection metal 170. The connection structure 140 may include a plurality of insulation layers 141a, 141b, and 141c, a plurality of redistribution layers 142a, 142b, and 142c disposed on the plurality of insulation layers 141a, 141b, and 141c, and a plurality of connection via layers 143a, 143b, and 143c penetrating the plurality of insulation layers 141a, 141b, and 141c. The plurality of insulation layers 141a, 141b, and 141c, the plurality of redistribution layers 142a, 142b, and 142c, and the plurality of connection via layers 143a, 143b, and 143c in the connection structure 140 may be provided with greater numbers of layers than that illustrated in the drawings. Alternatively, they may be designed with fewer numbers of layers than that illustrated in the drawings. That is, the number of layers is not particularly limiting.

As the material of the insulation layers 141a, 141b, and 141c, an insulating material may be used. In this case, in addition to the above-described insulating material, a photosensitive insulating material such as a photo-imageable dielectric (PID). For example, the insulation layers 141a, 141b, and 141c may be photosensitive insulation layers, respectively. When the insulation layers 141a, 141b, and 141c have photosensitivity, the insulation layers 141a, 141b, and 141c may be formed to be thinner, and the fine pitch of the connection via layers 143a, 143b, and 143c may be more easily achieved. When the insulation layers 141a, 141b, and 141c have multiple layers, these materials may be the same as each other, and may be different from each other, as required. When the insulation layers 141a, 141b, and 141c have multiple layers, since they are unified depending on a process, the boundaries may be unclear, but the present inventive concept may be not limited thereto.

The redistribution layers 142a, 142b, and 142c may serve to substantially redistribute the connection pad 122, and may provide the above-described electrical connection path. As a material for forming the redistribution layer, a metal material such as copper (Cu), aluminum (Al), silver (Ag), tin (Sn), gold (Au), nickel (Ni), lead (Pb), titanium (Ti), or alloys thereof may be used. The redistribution layers 142a, 142b, and 142c may also perform various functions, depending on the layers. For example, a ground pattern, a power pattern, a signal pattern, and the like, may be included. The ground pattern may be also identical to the signal pattern. In this case, the signal pattern may include various signals except for a ground pattern, a power pattern, and the like, for example, a data signal and the like. In this case, the pattern may be a concept including wiring and pads.

The connection via layers 143a, 143b, and 143c may electrically connect the redistribution layers 142a, 142b, and 142c formed on different layers, the connection pads 122 and the like to each other, to form an electrical path in the connection structure 140. As a material for forming the connection via layers 143a, 143b, and 143c, a metal material such as copper (Cu), aluminum (Al), silver (Ag), tin (Sn), gold (Au), nickel (Ni), lead (Pb), titanium (Ti), or alloys thereof may be used. The connection vias of each of the connection via layers 143a, 143b, and 143c may also be a field type filled with a metal material, or a conformal type in which a metal material is formed along a wall surface of a via hole. Further, the connection vias may each have a tapered cross-sectional shape.

The passivation layer 150 may be an additional structure for protecting the connection structure 140 from external physical or chemical damage, or the like. The passivation layer 150 may comprise a thermosetting resin. For example, the passivation layer 150 may be ABF, but is not limited thereto. The passivation layer 150 may have a plurality of openings that respectively expose at least a portion of a lowermost redistribution layer 142c. The number of openings may be in the range of tens to millions, or more or less. Although not specifically illustrated in the drawings, each of the openings may be formed of a plurality of holes.

The under-bump metal 160 may be an additional structure for improving the reliability of the connection metal 170. The under-bump metal 160 may be disposed in a plurality of openings in the passivation layer 150, respectively, to be electrically connected to the exposed lowest redistribution layer 142c, respectively. The under-bump metal 160 may comprise a metal material such as copper (Cu).

The connection metal 170 may be a structure for physically and/or electrically connecting the semiconductor package 100A to the outside. For example, the semiconductor package 100A may be mounted on the main board of the electronic device through the connection metal 170. The connection metal 170 may be disposed on the lower surface of the passivation layer 150, and may be connected to the under-bump metal 160. For example, the plurality of connection metals 170 may be electrically connected to the lowermost redistribution layer 142c exposed through the plurality of under-bump metals 160, respectively, in accordance with the functions thereof. As a result, the plurality of connection metals 170 may be electrically connected to the connection pad 122 of the semiconductor chip 120, in accordance with the functions thereof. The connection metal 170 may comprise a low melting point metal, for example, tin (Sn) or an alloy comprising tin (Sn). More specifically, the connection metal 170 may be formed of a solder or the like, but this is merely an example, and the material thereof is not particularly limited thereto.

The connection metal 170 may be a land, a ball, a pin, or the like. The connection metal 170 may be formed of multiple layers or a single layer. In a case of being formed of multiple layers, the connection metals 170 may include a copper pillar and a solder. In a case of a single layer, the connection metals 170 may include solder or copper, but is merely an example and is not limited thereto. The number, interval, arrangement type, etc., of the connection metals 170 are not particularly limited, and may be sufficiently modified, depending on a design specification by a skilled artisan. For example, the number of connection metals 170 may be in the range of tens to millions, depending on the number of connection pads 122, and may be more or less.

At least one of the connection metals 170 may be disposed in a fan-out area. The fan-out area refers to an area of the semiconductor package 100A, except for an area in which the semiconductor chip 120 is disposed. For example, a semiconductor package 100A according to an example may be a fan-out semiconductor package. The fan-out package may be more reliable than the fan-in package, may have many I/O terminals, and may facilitate 3D interconnection. In addition, a package thinner than a ball grid array (BGA) package, a land grid array (LGA) package, and the like, may be manufactured, and may be excellent in price competitiveness.

Figure 12A:
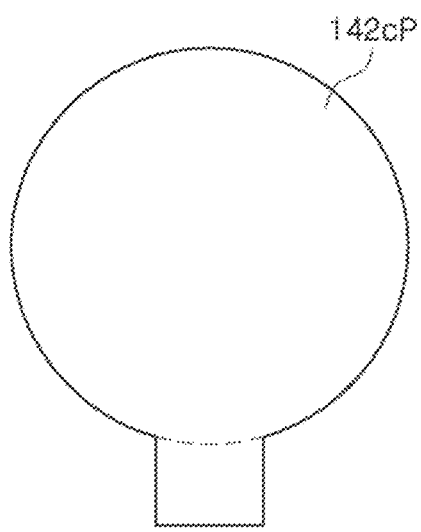
FIGS. 12A-12B are plan views schematically illustrating various shapes of pads for connection metal in a lowermost redistribution layer of a connection structure of FIG. 9, according to example embodiments.
Figure 12B:
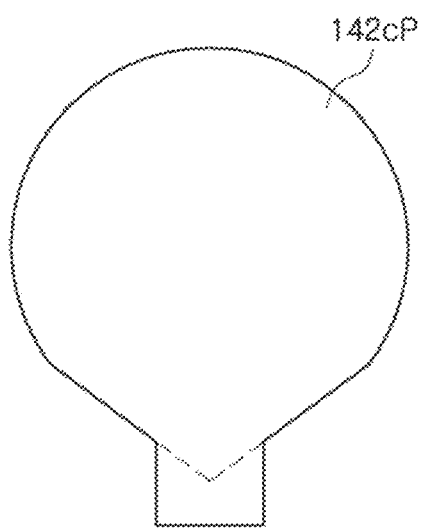

FIGS. 12A-12B are plan views schematically illustrating various shapes of pads for connection metal in a lowermost redistribution layer of a connection structure of FIG. 9, according to example embodiments.

Referring to FIGS. 12A and 12B, a connection metal pad 142cP may be a shape in which a fillet is not formed as illustrated in FIG. 12A, or may be a shape in which a fillet is added as illustrated in FIG. 12B. For example, the shape of the pad 142cP may be changed in accordance with a plating process.

Figure 13A:
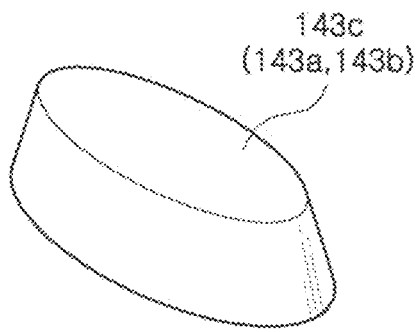
FIGS. 13A-13B schematically illustrate various examples of a shape of a connection via of a connection structure of FIG. 9, according to example embodiments.
Figure 13B:
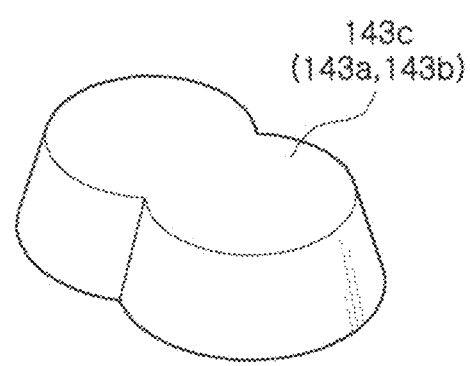

FIGS. 13A-13B schematically illustrate various examples of a shape of a connection via of a connection structure of FIG. 9, according to example embodiments.

Referring to FIGS. 13A-13B, the connection via of each of the connection via layers 143a, 143b, and 143c of the connection structure 140 may be an elliptical shape as illustrated in FIG. 13A, or a snowman shape as illustrated in FIG. 13B. For example, the connection via of each of the connection via layers 143a, 143b, and 143c may independently have a shape and arrangement of the first and second connection vias 143-1 and 143-2 described with reference to FIG. 11. In this case, each of the connection vias may be an elliptical shape, or a snowman shape in a specific shape. In other words, referring to FIG. 10, each of the connection vias may have an elliptical shape or a snowman shape independently of the remaining connection vias. In other words, the example embodiment shown in FIGS. 10 and 11 is only an example, and the example embodiments are not limited to the shape and arrangement shown in FIGS. 10 and 11.

FIGS. 14A-14D schematically illustrate various examples of upper and lower stack shapes of a connection via of a connection structure of FIG. 9, according to example embodiments.

Figure 14A:
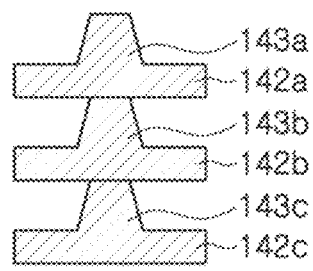
FIGS. 14A-14D schematically illustrate various examples of upper and lower stack shapes of a connection via of a connection structure of FIG. 9, according to example embodiments.
Figure 14B:
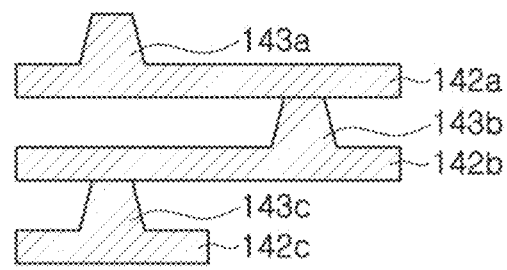
Figure 14C:
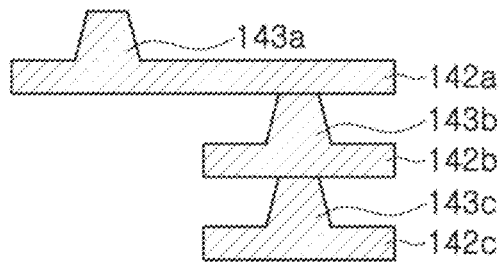
Figure 14D:
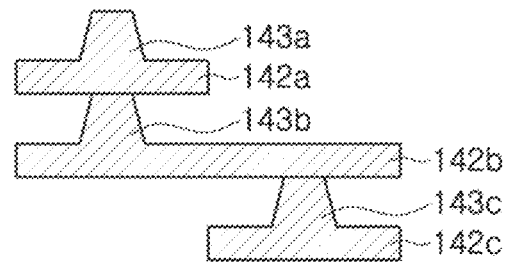

Referring to FIGS. 14A-14D, as illustrated in FIG. 14A, connection via layers 143a, 143b, and 143c of a connection structure 140 may be stacked vertically to at least partially overlap each other on a plane and, for example, may include stacked vias. Alternatively, as illustrated in FIG. 14B, connection via layers 143a, 143b, and 143c of a connection structure 140 may be stacked vertically such that the central axes thereof are staggered with respect to each other on a plane and, for example, may include staggered vias. Alternatively, as illustrated in FIGS. 14C and 14D, connection via layers 143a, 143b, and 143c of a connection structure 140 may include a structure in which at least two of the connection via layers 143a, 143b, and 143c are stacked vertically to at least partially overlap each other, and at least two of the connection via layers 143a, 143b, and 143c are stacked vertically such that the central axes thereof are staggered with respect to each other and, for example, may include a mixed structure of stacked vias and staggered vias. In this case, the connection vias of each of the connection via layers 143a, 143b, and 143c having such a mixed structure may independently have a shape and arrangement of the first and second connection vias 143-1 and 143-2 described with reference to FIG. 11, and the like. For example, in the case of FIG. 14A, the connection vias of the connection via layers 143a, 143b, and 143c constituting the stacked via may independently have a shape and arrangement of the first and second connection vias 143-1 and 143-2 described with reference to FIG. 11, and the like. A similar manner to the above will be also applied to FIGS. 14B-14D.

Figure 15:
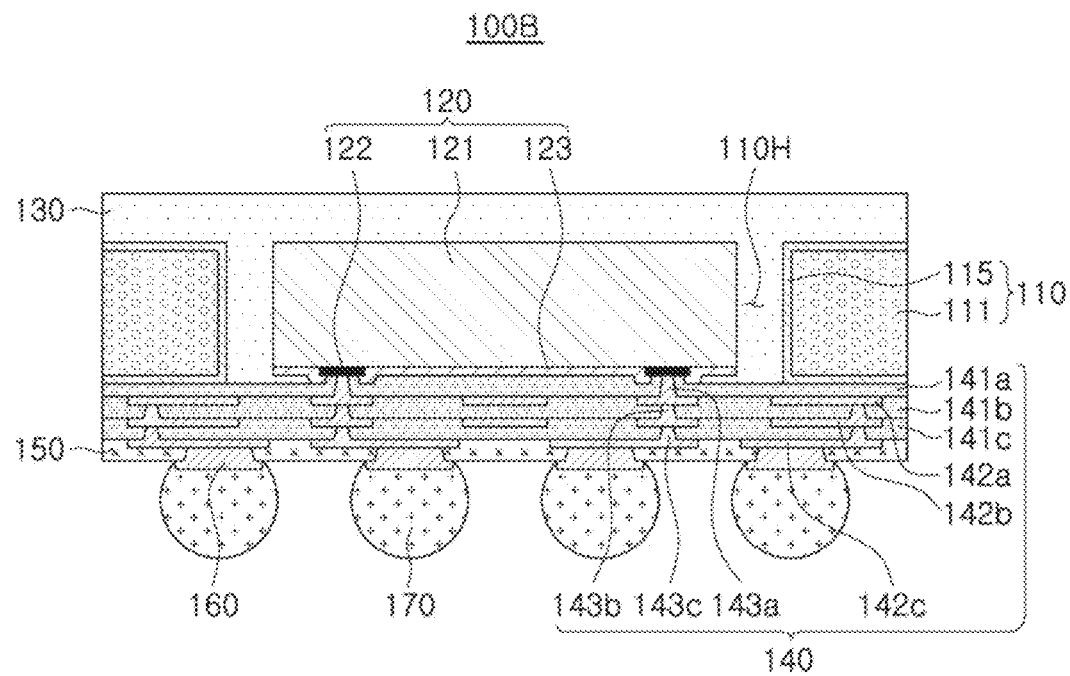
FIG. 15 is a cross-sectional view schematically illustrating another example of a semiconductor package, according to example embodiments.

FIG. 15 is a cross-sectional view schematically illustrating another example of a semiconductor package, according to example embodiments.

Referring to FIG. 15, a semiconductor package 100B may further include a frame 110 disposed on an upper surface of a connection structure 140 and having a through portion 110H. A semiconductor chip 120 may be disposed in the through portion 110H in a face-down manner such that a surface on which a connection pad 122 is disposed (i.e., an active surface) faces the upper surface of the connection structure 140. An encapsulant 130 may cover at least a portion of each of the frame 110 and the semiconductor chip 120, and may fill at least a portion of the through portion 110H. A metal layer 115 may be disposed on a wall surface of the through portion 110H of the frame 110, and the metal layer 115 may extend to upper and lower surfaces of the frame 110.

The frame 110 may further improve the rigidity of the semiconductor package 100B, in accordance with a specific material of an insulation layer 111 constituting the frame 110, and may play a role of securing uniformity of a thickness of the encapsulant 130. The frame 110 may have the through portion 110H, and the through portion 110H may be formed to penetrate the insulation layer 111 of the frame 110. The semiconductor chip 120 may be disposed in the through portion 110H, and a side surface of the semiconductor chip 120 may be surrounded by the wall surface of the through portion 110H.

As a material of the insulation layer 111, an insulating material may be used. As the insulating material, a thermosetting resin such as an epoxy resin, a thermoplastic resin such as polyimide, or a mixture of these resins with an inorganic filler, or a material impregnated with a core material such as a glass fiber, a glass cloth, or a glass fabric, together with an inorganic filler, such as a prepreg, an Ajinomoto Build-up Film (ABF), FR-4, a bismaleimide triazine (BT), or the like, may be used. From the viewpoint of warpage control, a prepreg may be preferably used.

The metal layer 115 may be an additional structure for heat dissipation and electromagnetic wave shielding, and may cover the entire wall surface of the through portion 110H to surround a side surface of the semiconductor chip 120. Therefore, electromagnetic wave shielding to the semiconductor chip 120 may be effectively performed, and heat generated from the semiconductor chip 120 may be effectively emitted. The metal layer 115 may include a known metal material such as copper (Cu).

Since other specific descriptions may be substantially the same as those described in the semiconductor package 100A described above, a detailed description thereof will be omitted for conciseness. For example, in various example embodiments, the features of the semiconductor package 100A described with reference to FIGS. 10 to 13 may be applied to the semiconductor package 100B.

Figure 16:
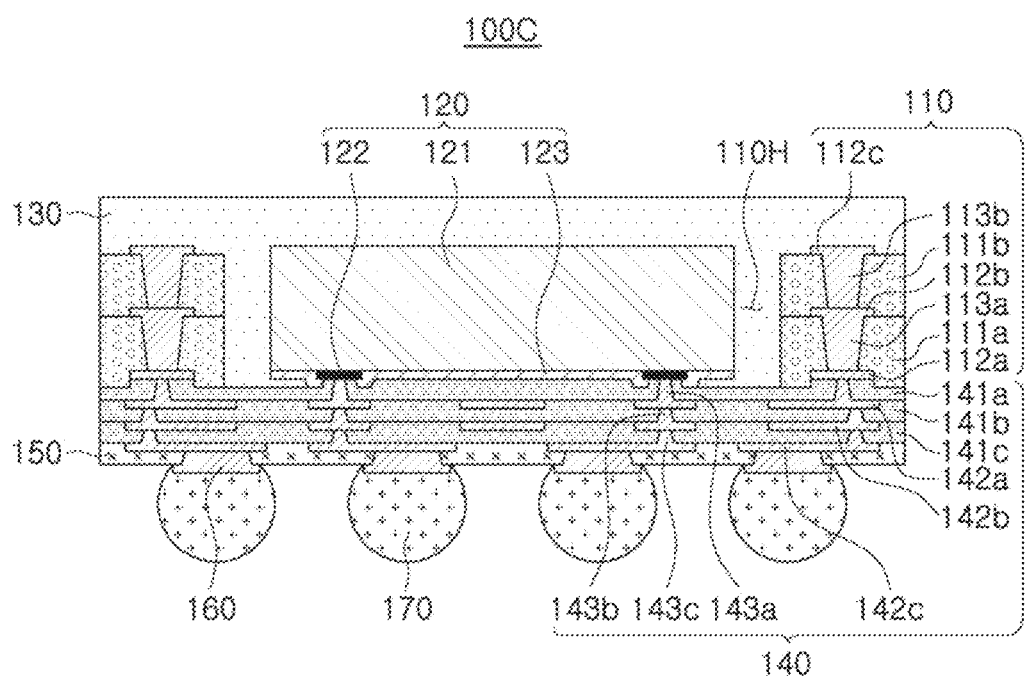
FIG. 16 is a cross-sectional view schematically showing another example of a semiconductor package, according to example embodiments.

FIG. 16 is a cross-sectional view schematically showing another example of a semiconductor package, according to example embodiments.

Referring to FIG. 16, a semiconductor package 100C may have a frame 110 in a different form. Specifically, in another example, the frame 110 may include a first insulation layer 111a; a first wiring layer 112a in contact with an upper surface of a connection structure 140 and embedded in the first insulation layer 111a; a second wiring layer 112b disposed on a side opposite to a side in which the first wiring layer 112a of the first insulation layer 111a is embedded; a second insulation layer 111b disposed on a side opposite to a side in which the first wiring layer 112a of the first insulation layer 111a is embedded, and embedding the second wiring layer 112b; a third wiring layer 112c disposed on a side opposite to a side in which the second wiring layer 112b of the second insulation layer 111b is embedded; a first wiring via layer 113a penetrating the first insulation layer 111a to electrically connect the first and second wiring layers 112a and 112b; and a second wiring via layer 113b penetrating the second insulation layer 111b to electrically connect the second and third wiring layers 112b and 112c. The frame 110 may include the first to third wiring layers 112a, 112b, and 112c to simplify configurations of redistribution layers 142a, 142b, and 142c. The wiring layers 112a, 112b, and 112c may be electrically connected to one or more connection pads 122 through the redistribution layers 142a, 142c, and 142c in accordance with their functions.

As a material of the insulation layers 111a and 111b, an insulating material may be used. As the insulating material, a thermosetting resin such as an epoxy resin, a thermoplastic resin such as polyimide, or a mixture of these resins with an inorganic filler, or a material impregnated with a core material such as a glass fiber, a glass cloth, or a glass fabric, together with an inorganic filler, such as a prepreg, an ABF, FR-4, a BT, or the like, may be used. From the viewpoint of warpage control, a prepreg may be preferably used.

The first to third wiring layers 112a, 112b, and 112c together with the first and second wiring via layers 113a and 113b may provide a vertical electrical connection path in the semiconductor package 100C. As materials for forming the first to third wiring layers 112a, 112b, and 112c, respectively, a metal material such as copper (Cu), aluminum (Al), silver (Ag), tin (Sn), gold (Au), nickel (Ni), lead (Pb), titanium (Ti), or alloys thereof may be used. The first to third wiring layers 112a, 112b, and 112c may also perform various functions, depending on the layers. For example, a ground pattern, a power pattern, a signal pattern, and the like, may be included. The ground pattern may be also identical to the signal pattern. In this case, the signal pattern may include various signals except for a ground pattern, a power pattern, and the like, for example, a data signal and the like. In this case, the pattern may be a concept including wiring and pads.

The first wiring layer 112a may be recessed into the first insulation layer 111a. For example, a surface of the first insulation layer 111a, contacting an upper surface of the connection structure 140, may have a step difference from a surface of the first wiring layer 112a, contacting an upper surface of the connection structure 140. In this case, when the frame 110 and the semiconductor chip 120 are encapsulated with an encapsulant 130, the encapsulant material may be prevented from being bleed and contaminating the first wiring layer 112a. A thickness of each of the first to third wiring layers 112a, 112b, and 112c may be thicker than a thickness of each of the redistribution layers 142a, 142b, and 142c.

The first and second wiring via layers 113a and 113b may electrically connect the first to third wiring layers 112a, 112b, and 112c formed in different layers, thereby forming an electrical path in the frame 110. The first and second wiring via layers 113a and 113b may also be formed of the above-described metal materials. The wiring vias in each of the first to second wiring via layers 113a and 113b may be a field type filled with a metal material, or a conformal type in which a metal material is formed along a wall surface of a via hole.

A portion of the pads of the first wiring layer 112a may serve as a stopper, when a hole for the first wiring via layer 113a is formed. The wiring via of the first wiring via layer 113a may be advantageous in terms of a tapered shape in which a width of an upper surface thereof is narrower than a width of a lower surface thereof. For example, the wiring via of the first wiring via layer 113a may become smaller from the second wiring layer 112b toward the first wiring layer 112a. In this case, the wiring via of the first wiring via layer 113a may be integrated with a pad pattern of the second wiring layer 112b. Similarly, when a hole for the second wiring via layer 113b is formed, a portion of the pads of the second wiring layer 112b may serve as stoppers. The wiring via of the second wiring via layer 113b may be advantageous in terms of a tapered shape in which a width of an upper surface thereof is narrower than a width of a lower surface thereof. For example, the wiring via of the second wiring via layer 113b may become smaller from the third wiring layer 112c to the second wiring layer 112b. In this case, the wiring via of the second wiring via layer 113b may be integrated with a pad pattern of the third wiring layer 112c.

Since other specific descriptions may be substantially the same as those described in the semiconductor package 100A above, a detailed description thereof will be omitted for conciseness. For example, in various example embodiments, the features described with reference to FIGS. 10 to 13 may be applied to the semiconductor package 100C.

Figure 17:
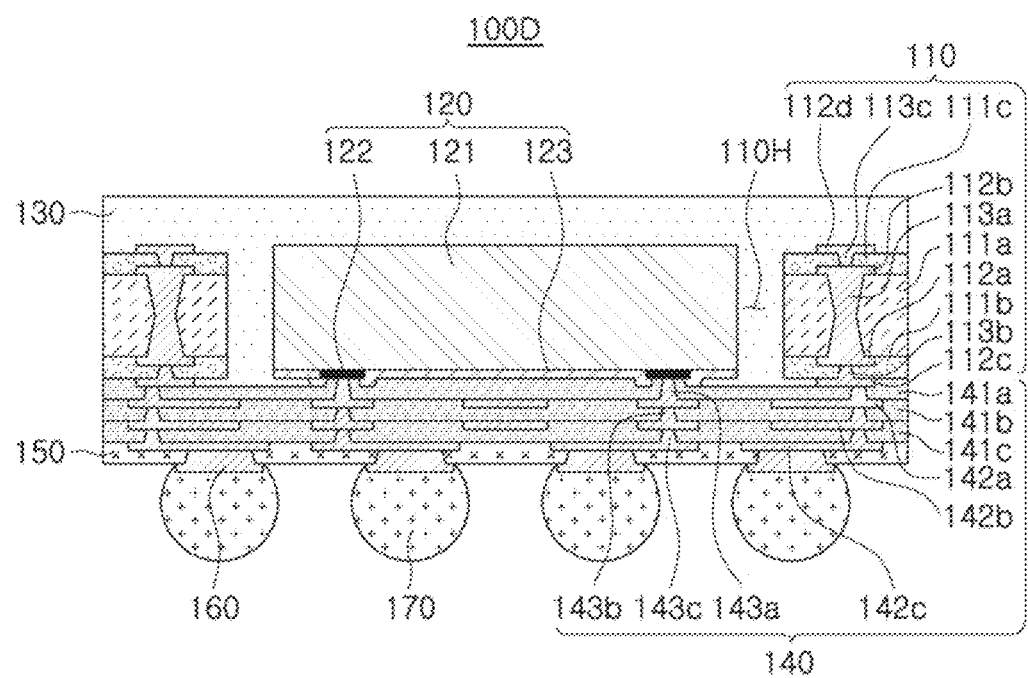
FIG. 17 is a cross-sectional view schematically illustrating another example of a semiconductor package, according to example embodiments.

FIG. 17 is a cross-sectional view schematically illustrating another example of a semiconductor package, according to example embodiments.

Referring to FIG. 17, a semiconductor package 100D according to another example may have a frame 110 in a different form. Specifically, in another example, the frame 110 may include a first insulation layer 111a; a first wiring layer 112a and a second wiring layer 112b respectively disposed on both surfaces of the first insulation layer 111a; a second insulation layer 111b and a third insulation layer 111c respectively disposed on both surfaces of the first insulation layer 111a and embedded in the first and second wiring layers 112a and 112b; a third wiring layer 112c disposed on a side opposite to a side in which the first wiring layer 112a of the second insulation layer 111b is embedded; a fourth wiring layer 112d disposed on a side opposite to a side in which the second wiring layer 112b of the third insulation layer 111c is embedded; a first wiring via layer 113a penetrating the first insulation layer 111a and electrically connecting the first and second wiring layers 112a and 112b; a second wiring via layer 113b penetrating the second insulation layer 111b and electrically connecting the first and third wiring layers 112a and 112c; and a third wiring via layer 113c penetrating the third insulation layer 111c and electrically connecting the second and fourth wiring layers 112b and 112d. Since the frame 110 has a larger number of wiring layers 112a, 112b, 112c, and 112d, the connection structure 140 may be further simplified.

The first insulation layer 111a may be thicker than each of the second insulation layer 111b and the third insulation layer 111c. The first insulation layer 111a may be relatively thick to maintain rigidity, and the second insulation layer 111b and the third insulation layer 111c may be introduced to form a larger number of wiring layers 112c and 112d. Similarly, the wiring via of the first wiring via layer 113a penetrating the first insulation layer 111a may have a height and an average diameter greater than those of each of the wiring vias of the second and third wiring via layers 113b and 113c penetrating the second and third insulation layers 111b and 111c. Further, the wiring vias of the first and second wiring via layers 113a and 113c may have taper shapes opposite to each other, while the wiring via of the first wiring via layer 113a may have an hourglass or cylindrical shape, respectively. For example, the wiring vias in the first wiring via layer 113a may become smaller from the both surfaces of the first insulation layer 111a to the inside of the wiring vias. In addition, the wiring via of the second wiring via layer 113b may become smaller from the third wiring layer 112c to the first wiring layer 112a. In addition, the wiring via of the third wiring via layer 113c may become smaller from the fourth wiring layer 112d to the second wiring layer 112b. A thickness of each of the first to fourth wiring layers 112a, 112b, 112c, and 112d may be thicker than a thickness of each of the redistribution layers 142a, 142b, and 142c.

Since other specific descriptions may be substantially the same as those described in the semiconductor package 100A above, a detailed description thereof will be omitted for conciseness. For example, in various example embodiments, the features described with reference to FIGS. 10 to 13 may be applied to the semiconductor package 100D according to another example.

EXPERIMENTAL EXAMPLE

TABLE 1

|  | $\theta_1$ (=$\theta_2$) | Stress | Interfacial Peeling | Cracks |
| --- | --- | --- | --- | --- |
| *EE1 | 90° | 0.77 | Good | Good |
| EE2 | 70° | 0.80 | Good | Good |
| EE3 | 50° | 0.83 | Good | Good |
| EE4 | 30° | 0.87 | Fair | Fair |
| EE5 | 10° | 0.90 | Poor | Poor |
| EE6 | 0° | 0.91 | Poor | Poor |

*EE: Experimental Example

In the above Table 1, stress may be a relative value measured using a simulation. The term "good" refers to a case in which the interfacial peeling and/or cracks hardly occur and the reliability is good; the term "fair" refers to a case in which the interfacial peeling and/or cracks occurs to some extent but is generally acceptable, and the reliability is fair; and the term "poor" refers to a case in which the interfacial peeling and/or cracks occurs to be problematic, and the reliability is poor.

As can be seen from the above Table 1, when $\theta_1$ and/or $\theta_2$ satisfy $30° \leq \theta_1 \leq 90°$ and/or $30° \leq \theta_2 \leq 90°$, the stress S applied to the first connection via 143-1 and/or the second connection via 143-2 may become sufficiently small. For example, for $50° \leq \theta_1 \leq 90°$ and/or $50° \leq \theta_2 \leq 90°$, the stress S may become sufficiently small to produce a "good" value. In addition, it may be seen that the reliability is relatively good, for example, interfacial peeling and/or cracks hardly occur in the first connection via 143-1 and/or the second connection via 143-2, and the like.

In the present specification, the words "lower", "lower portion", "lower surface", and the like are used to refer to the downward direction with respect to the cross section of the drawing for convenience, while the words "upper", "upper portion", "upper surface", and the like are used to refer to a direction opposite thereto. It should be understood that, the definitions refer to directions for convenience of explanation, the scope of the claims is not particularly limited by the description of such directions, and the concepts of the upward/downward directions may be changed at any time.

The term of "connect" or "connection" in the present specification may be not only a direct connection, but also a concept including an indirect connection through an adhesive layer or the like. In addition, the term "electrically connected" or "electrical connection" in the present specification is a concept including both a physical connection and a physical non-connection. Also, the expressions of "first," second," etc. in the present specification are used to distinguish one component from another, and do not limit the order and/or importance of the components. In some cases, without departing from the spirit of the present disclosure, a "first" component may be referred to as a "second" component, and similarly, a "second: component may be referred to as a "first" component.

The expression "example", except in relation to experimental examples, used in this specification does not refer to the same embodiment to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

The terms used in this disclosure are used only to illustrate various examples and are not intended to limit the present inventive concept. Singular expressions include plural expressions unless the context clearly dictates otherwise.

According to an aspect of various embodiments, a semiconductor package that may effectively reduce the structural stress of a connection via of a connection structure may be provided.

While example embodiments have been shown and described above, it will be apparent to those skilled in the art that modifications and variations could be made without departing from the scope of the present inventive concept as defined by the appended claims.

What is claimed is:

1. A semiconductor package comprising:
   a connection structure having a first surface, and a second surface opposite to the first surface, the connection structure including a redistribution layer and a connection via layer;
   a semiconductor chip disposed on the first surface of the connection structure; and
   a plurality of connection metals disposed on the second surface of the connection structure,
   wherein the connection via layer comprises a plurality of connection vias, a first connection via of the plurality of connection vias is electrically connected to a first connection metal of the plurality of connection metals, and in plan view, when a center of the first connection metal is denoted by $C_1$, a center of the first connection via is denoted by $C_2$, a line passing through $C_1$ and $C_2$ is denoted by $L_1$, a line intersecting $L_1$ and passing through $C_2$ is denoted by $L_2$, a distance between two points on an edge of the first connection via that are on $L_1$ is denoted by $D_1$, a distance between two points on an edge of the first connection via that are on $L_2$ is denoted by $D_2$, and an angle formed by $L_1$ and $L_2$ is denoted by $\theta_1$, the following relationships are satisfied:

$D_1 < D_2$ $30° \leq \theta_1 \leq 90°$.

2. The semiconductor package according to claim 1, wherein $D_2$ is a distance of a longest major axis among distances between any two points on the edge of the first connection via that passes through $C_2$.

3. The semiconductor package according to claim 1, wherein the first connection via does not overlap the first connection metal on a plane.

4. The semiconductor package according to claim 1, wherein a second connection via of the plurality of connection vias is electrically connected to a second connection metal of the plurality of connection metals, and in the plan view, when a center of the second connection metal is denoted by $C_3$, a center of the second connection via is denoted by $C_4$, a line passing through $C_3$ and $C_4$ is denoted by $L_3$, a line intersecting $L_3$ and passing through $C_4$ is denoted by $L_4$, a distance between two points on an edge of the second connection via that are on $L_3$ is denoted by $D_3$, a distance between two points on an edge of the second connection via that are on $L_4$ is denoted by $D_4$, and an angle formed by $L_3$ and $L_4$ is denoted by $\theta_2$, the following relationships are satisfied:

$D_3 < D_4$, and $30° \leq \theta_2 \leq 90°$.

5. The semiconductor package according to claim 4, wherein $D_4$ is a distance of a longest major axis among distances between any two points on the edge of the second connection via that passes through $C_4$.

6. The semiconductor package according to claim 5, wherein, in the plan view, when a center of the semiconductor package is denoted by $C_0$, a line passing through $C_0$ and $C_2$ is denoted by $L_5$, a line passing through $C_0$ and $C_4$ is denoted by $L_6$, an angle formed by $L_2$ and $L_5$ is denoted by $\theta_3$, and an angle formed by $L_4$ and $L_6$ is denoted by $\theta_4$, $\theta_3$ and $\theta_4$ are different from each other.

7. The semiconductor package according to claim 1, wherein the connection structure comprises a plurality of insulation layers disposed on different levels of the connection structure, a plurality of redistribution layers disposed on the plurality of insulation layers, and a plurality of connection via layers each penetrating respective ones of the plurality of insulation layers.

8. The semiconductor package according to claim 7, wherein a connection via layer among the plurality of connection via layers that is closest to the second surface of the connection structure comprises the first connection via.

9. The semiconductor package according to claim 7, wherein each of the plurality of connection via layers comprise the first connection via, and each of the first connection via in the plurality of connection via layers is vertically stacked to at least partially overlap each other on a plane.

10. The semiconductor package according to claim 7, wherein each of the plurality of connection via layers comprise the first connection via, and at least two of the first connection vias in the plurality of connection via layers are stacked vertically such that central axes thereof are staggered with respect to each other on a plane.

11. The semiconductor package according to claim 7, wherein the plurality of connection via layers comprise at least one of a stacked via and a staggered via.

12. The semiconductor package according to claim 1, wherein the first connection via has an elliptical shape or a snowman shape.

13. The semiconductor package according to claim 1, further comprising:

a passivation layer disposed on the second surface of the connection structure, and having a plurality of openings exposing at least a portion of the redistribution layer; and a plurality of under-bump metals disposed on the plurality of openings and electrically connected to the exposed redistribution layer, wherein the plurality of connection metals are connected to the plurality of under-bump metals, respectively.

14. The semiconductor package according to claim 1, wherein each of the plurality of connection metals comprise at least one low melting point metal selected from the group consisting of tin (Sn) and an alloy containing tin (Sn).

15. The semiconductor package according to claim 1, further comprising:

a frame disposed on the first surface of the connection structure and having a through portion in which the semiconductor chip is disposed; and an encapsulant covering at least a portion of each of the frame and the semiconductor chip, respectively, and filling at least a portion of the through portion, wherein the semiconductor chip is disposed in the through portion such that a surface on which a connection pad is disposed faces the first surface of the connection structure.

16. The semiconductor package according to claim 15, wherein the frame comprises:

a first insulation layer;

a first wiring layer embedded in the first insulation layer, and in contact with the first surface of the connection structure;

a second wiring layer disposed on a side opposite to a side in which the first wiring layer of the first insulation layer is embedded;

a first wiring via layer penetrating the first insulation layer to electrically connect the first wiring layer and the second wiring layer;

a second insulation layer disposed on a side opposite to a side in which the first wiring layer of the first insulation layer is embedded, the second insulation layer embedding the second wiring layer;

a third wiring layer disposed on a side opposite to a side in which the second wiring layer of the second insulation layer is embedded; and a second wiring via layer penetrating the second insulation layer to electrically connect the second wiring layer and the third wiring layer, wherein the through portion penetrates the first insulation layer and the second insulation layer, wherein a wiring via of the first wiring via layer decreases in size from the second wiring layer to the first wiring layer, and wherein a wiring via of the second wiring via layer decreases in size from the third wiring layer to the second wiring layer.

17. A semiconductor package comprising:

a connection structure including a redistribution layer and a connection via layer;

a semiconductor chip above the connection structure; and a plurality of connection metals below the connection structure, including a first connection metal and a second connection metal, wherein the connection via layer includes a first connection via electrically connected to the first connection metal and a second connection via electrically connected to the second connection metal, in plan view, a length of a first line between any two points on an edge of the first connection via and passing through a center of the first connection via is longer than a length of a second line between any other two points on the edge of the first connection via and passing through the center of the first connection via, in the plan view, a length of a third line between any two points on an edge of the second connection via passing through a center of the second connection via, is longer than a length of a fourth line between any other two points on the edge of the second connection via passing through the center of the second connection via, and in the plan view, an angle formed by the first line and a fifth line, the fifth line passing through the center of the first connection via and a center of the semiconductor package, and an angle formed by the third line and a sixth line, the sixth line passing through the center of the second connection via and the center of the semiconductor package, are different from each other.

18. The semiconductor package according to claim 17, wherein the first line is a distance of a longest major axis among distances between any two points on the edge of the first connection via that passes through the center of the first connection via, and the third line is a distance of a longest major axis among distances between any two points on the edge of the second connection via that passes through the center of the second connection via.

19. A semiconductor package comprising:

a connection structure including a plurality of connection via layers;

a semiconductor chip above the connection structure; and a connection metal below the connection structure, wherein the plurality of connection via layers include a first connection via electrically connected to the connection metal, respectively, in plan view, a length of a first line between any two points on an edge of the first connection via and passing through a center of the first connection via is longer than a length of a second line between any other two points on the edge of the first connection via and passing through the center of the first connection via, and at least two connection via layers of the plurality of connection via layers are vertically stacked to at least partially overlap in the plan view, and at least two connection via layers of the plurality of connection via layers are stacked vertically such that central axes thereof are staggered.

20. The semiconductor package according to claim 19, wherein, in the plan view, the first connection via has an elliptical shape or a snowman shape.

* * * * *